United States Patent [19]

Elmore

[11] 4,398,232

[45] Aug. 9, 1983

[54] PROTECTIVE RELAYING METHODS AND APPARATUS

[75] Inventor: Walter A. Elmore, Coral Springs, Fla.

[73] Assignee: Westinghouse Electric Corp., Pittsburgh, Pa.

[21] Appl. No.: 321,158

[22] Filed: Nov. 13, 1981

[51] Int. Cl.[3] .............................................. H02H 3/16
[52] U.S. Cl. ........................................ 361/47; 324/51; 361/79
[58] Field of Search ................... 361/42, 47, 76, 77, 361/79, 85; 324/51, 52; 340/650, 651

[56] References Cited

U.S. PATENT DOCUMENTS 4,146,913 3/1979 Sun .......................................... 361/76

FOREIGN PATENT DOCUMENTS 52-68938 6/1977 Japan ..................................... 361/42
53-130078 11/1978 Japan ..................................... 324/51

*Primary Examiner*—Harry E. Moose, Jr.
*Attorney, Agent, or Firm*—D. R. Lackey

[57] ABSTRACT

Methods and apparatus for detecting a single-phase-to-ground fault on a three-phase electrical power system, and for identifying a faulted phase. A single-phase-to-ground fault is correctly distinguished from other faults, including phase-to-phase-to-ground faults, even with transmission lines which utilize series capacitors, by taking into consideration the phase-to-phase voltage which is in quadrature with the voltage to ground of the monitored phase.

11 Claims, 13 Drawing Figures

AG
(PHASE B MONITOR)

AG
(PHASE C MONITOR)

BCG
(PHASE A MONITOR)

PROTECTIVE RELAYING METHODS AND APPARATUS

BACKGROUND OF THE INVENTION

1. Field of the Invention

The invention relates in general to protective relaying methods and apparatus, and more specifically to methods and apparatus for detecting a single-phase-to-ground fault on a three-phase electrical power system, and for identifying the faulted phase.

2. Description of the Prior Art

Faults on three-phase electrical power transmission lines are usually transient single-phase-to-ground faults, which can be cleared by opening and high-speed reclosing of only the phase associated with the fault. Single-pole tripping enables synchronizing power to be exchanged between the other two phases, and it minimizes system shock. A large generation plant, for example, connected to the electrical power system via a single transmission line retains synchronization when single-pole tripping is used, as opposed to three-pole tripping. Three-pole tripping requires the machines to be resynchronized before reconnection.

In single-pole tripping, the protective relays must be able to distinguish a single-phase-to-ground fault from a phase-to-phase fault, a double-phase-to-ground fault, and three-phase faults, and correctly identify the faulted phase. One prior art approach uses current level detectors in each of the three phases of a transmission line. A phase-to-ground fault is identified when one current is high and the other two currents are low. This method has certain disadvantages, however, as accurate phase selection is only possible when the fault current reliably and appreciably exceeds load current, and the symmetrical component distribution factors are similar in the positive and zero sequence networks.

Another prior art approach takes advantage of the fact that for single-phase-to-ground faults, the negative and zero sequence currents are essentially inphase for the faulted phase, and essentially 120° out of phase for the unfaulted phases. This concept, however, cannot be used without additional relaying units which distinguish between a single-phase-to-ground fault and a phase-to-phase-to-ground fault, as in the latter, the negative and zero sequence currents are essentially inphase for the phase which is not involved in the fault. For example, an additional relaying unit may be provided which senses the magnitudes of the three phase-to-ground voltages. This relaying unit is set to operate only when one voltage is higher than the other two, thus identifying a phase-to-phase-to-ground fault. This relaying unit thus overrides the selection of a single pole by the phase selector relay, and causes all three poles to trip. While satisfactory operation can be obtained with this arrangement, the application is difficult because of the choice of levels for "high" and "low" voltages, and what difference value is a suitable criterion for making a decision that a phase-to-phase-to-ground fault exists.

Thus, it would be desirable to be able to provide new and improved protective relaying methods and apparatus for detecting a single-phase-to-ground fault, and for identifying the faulted phase, which methods and apparatus are not critically dependent upon the selection of analog magnitude values, and their differences, for proper setup and operation.

SUMMARY OF THE INVENTION

Briefly, the present invention relates to new and improved methods and apparatus for detecting a single-phase-to-ground fault on a three-phase electrical power system, and for identifying the faulted phase. Each phase is monitored using phasor signals responsive to (1) the sum of the three phase currents, (2) the negative sequence current referenced to the monitored phase, and (3) the phase-to-phase voltage, which is in quadrature with the phase-to-ground voltage of the monitored phase. A predetermined phase angle relationship between these three phasor signals for a phase indicates the system has a single-phase-to-ground fault, with the identified phase being the faulted phase.

BRIEF DESCRIPTION OF THE DRAWINGS

The invention may be better understood, and further advantages and uses thereof more readily apparent, when considered in view of the following detailed description of exemplary embodiments, taken with the accompanying drawings in which.

DESCRIPTION OF PREFERRED EMBODIMENTS

The present invention relates only to methods and apparatus for identifying a single-phase-to-ground fault, and for identifying the phase involved in such a fault. Other relays are required to use this information in a complete protective relaying system. Since the additional relays required depend upon the specific application, and are well known in the art, they will not be shown or described in detail. For example, if the apparatus of the invention is to be used in a single-pole tripping arrangement, the protective relaying system may be of the pilot type, with a suitable system being shown and described on pages 16-23 through 16-25 of a publication entitled "Applied Protective Relaying" © 1979, by Westinghouse Electric Corporation, Relay-Instrument Division, Coral Springs, Florida 33065.

Figure 1:
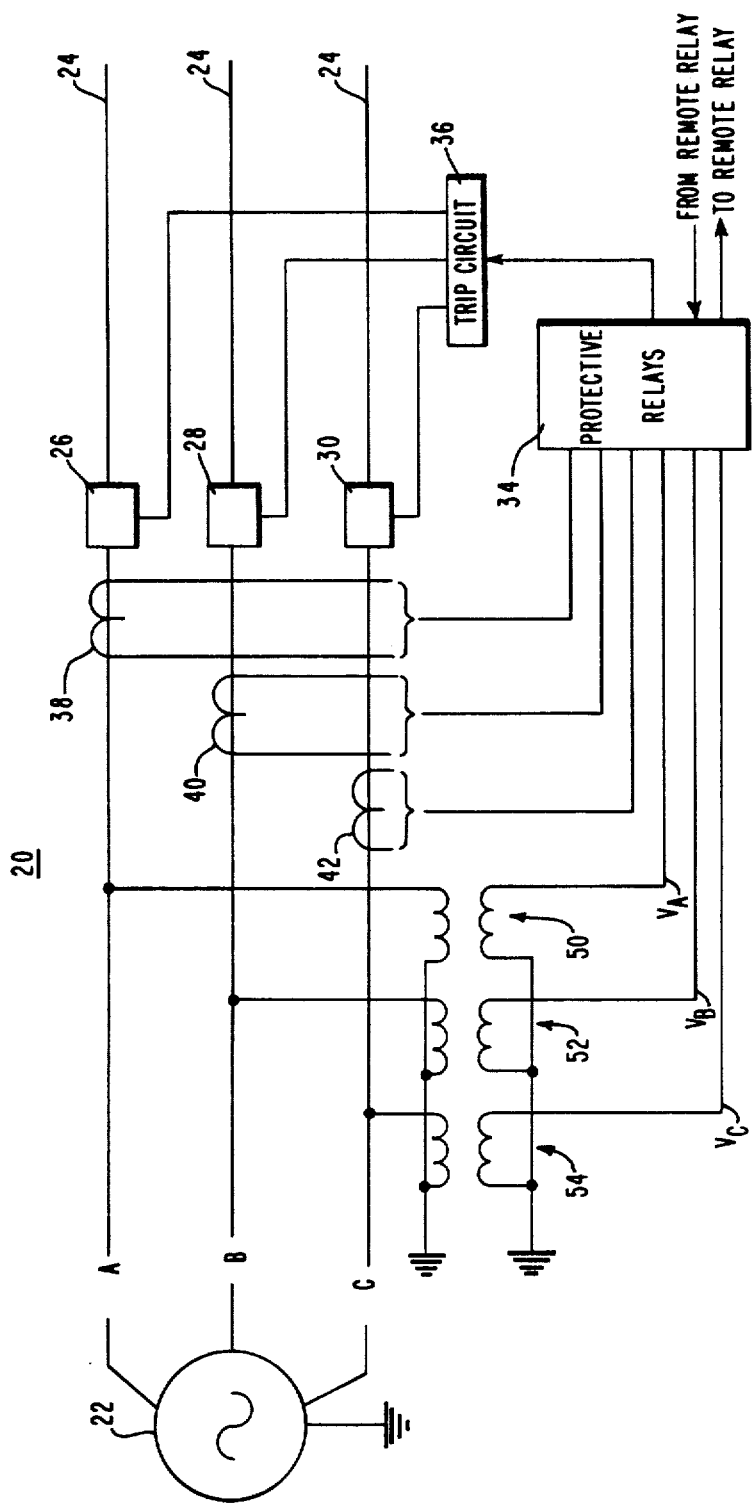
FIG. 1 is a schematic diagram of a three-phase, alternating voltage, electrical power transmission line, illustrating a protective relaying system which may utilize the teachings of the invention.

Referring now to the drawings, and to FIG. 1 in particular, there is shown a three-phase electrical power transmission line system 20, having phases A, B and C connected to a source 22 of three-phase alternating electrical power, such as 60 Hz. Phases A, B and C are connected to a three-phase electrical power transmission line 24 via power circuit breakers 26, 28 and 30, respectively, with the power circuit breakers having separate operating mechanisms, if they are to be used in a single-pole tripping system.

Figure 3:
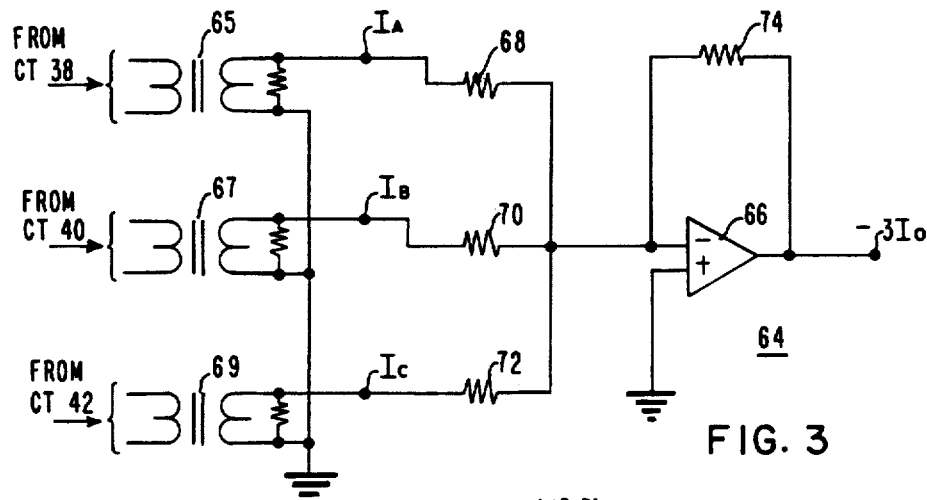
FIG. 3 is a schematic diagram of apparatus which may be used for a function shown in block form in FIG. 2, for providing a signal proportional to the $3I_O$ ground or residual unbalanced current.

A protective relaying system 34 provides signals for trip circuits 36 associated with the circuit breakers 26, 28 and 30, in response to the phase currents and phase voltages of the three-phase electrical power system 20. Current transformers 38, 40 and 42 provide current signals responsive to the phase A, B and C currents, respectively, which currents are applied to isolating current transformers in system 34. Resistors across the output windings of these isolating current transformers provide voltage signals responsive to the phase currents. These voltage signals responsive to the phase currents are referred to as $I_A$, $I_B$ and $I_C$. FIG. 3 illustrates the development of these signals. Voltage transformers 50, 52 and 54 provide voltage signals $V_A$, $B_B$ and $V_C$ responsive to the phase A, B and C voltages to ground, respectively, which signals are applied to voltage potential transformers in system 34.

Figure 2:
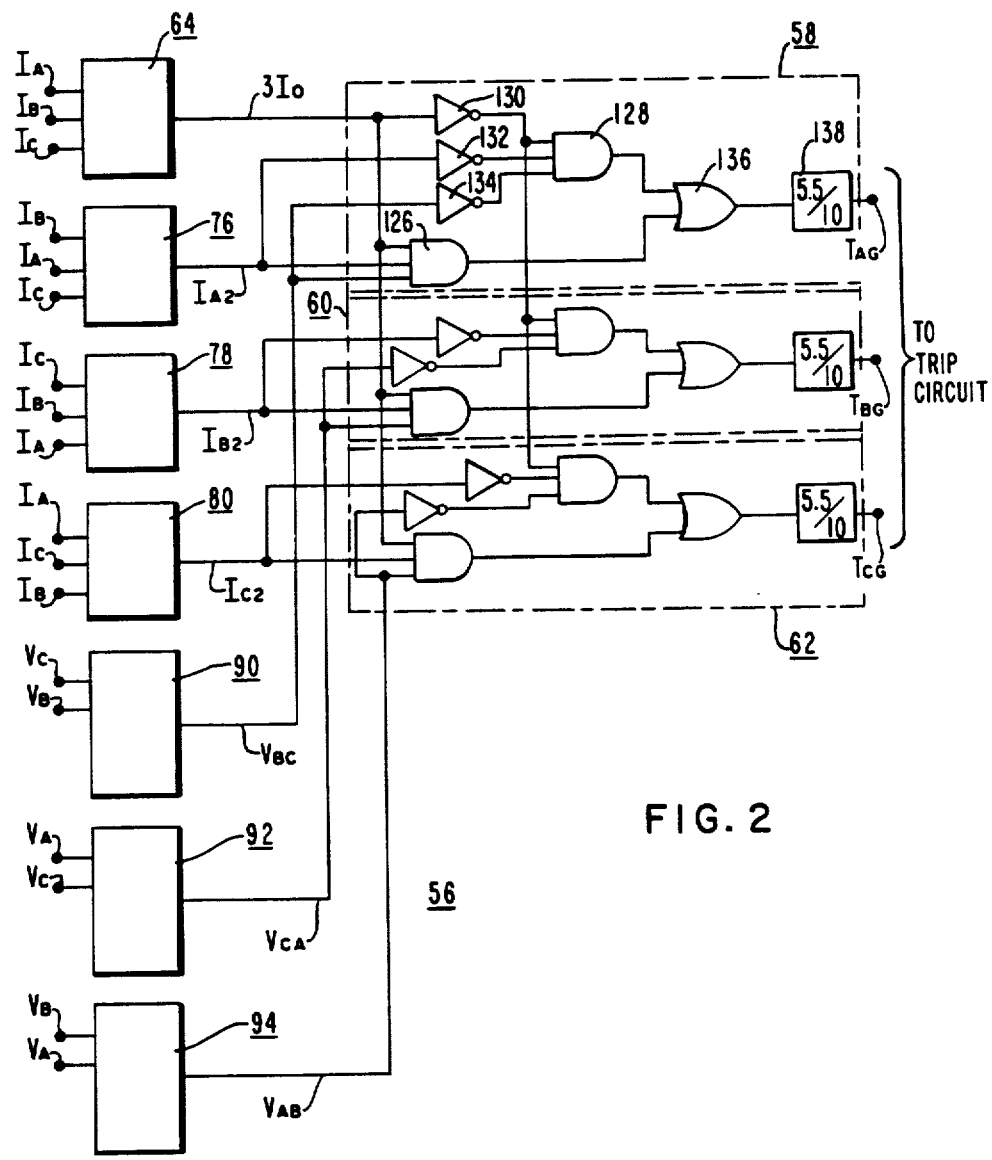
FIG. 2 is a partially schematic and partially block diagram of protective relaying apparatus constructed according to the teachings of the invention, which may be used in the protective relaying system of FIG. 1.

FIG. 2 is a partially schematic and partially block diagram of protective relaying apparatus 56 constructed according to the teachings of the invention, which may be used in the protective relaying system 34 shown in FIG. 1. Apparatus 56 detects a single-phase-to-ground fault, and it identifies the faulted phase.

Before describing apparatus 56 in detail, it will be helpful to briefly set forth the new and improved protective relaying method which is implemented by apparatus 56. The method includes the step of monitoring each phase, with the steps associated with the monitoring of a phase including providing a first phasor signal responsive to the unbalanced or $3I_O$ ground current flowing in the three-phase system, providing a second phasor signal indicative of a negative sequence quantity, referenced to the phase being monitored, and providing a third phasor signal responsive to the line-to-line voltage which is in quadrature with the phase voltage being monitored. The negative sequence quantity may be the negative sequence current, or the negative sequence voltage shifted CCW by 90° (+j). The method then includes the steps of comparing the phase angles of the first, second and third phasor signals, and providing a signal when they are within 60° of one another. When this signal is provided, it indicates the three-phase system has a single-phase-to-ground fault, and that the fault is on the phase associated with the monitor providing the signal.

Returning now to FIG. 2, protective relaying apparatus 56 includes phase monitoring means 58, 60, and 62 for phases A, B and C, respectively, which means perform the functions of comparing the phase angles of the first, second and third phasor signals, and for providing an output signal when the phase angles of the compared signals are within 60° of one another.

The first phasor signal, which will be referred to as signal $3I_O$, since it is responsive to the residual ground current, is provided in response to signals $I_A$, $I_B$ and $I_C$ by means shown generally at 64. Suitable means 64 for providing signal $3I_O$ is shown in FIG. 3. An operational amplifier (op amp) 66 is connected as an adder, with signals $I_A$, $I_B$ and $I_C$ being developed from the outputs of current transformers 38, 40 and 42, respectively, via CT and resistor arrangements 65, 67 and 69, respectively. Signals $I_A$, $I_B$ and $I_C$ are applied to the inverting input of op amp 66 through resistors 68, 70 and 72, respectively. A feedback resistor 74 connects its output to the inverting input, and its non-inverting input is connected to ground. The output voltage $-3I_O$, which may be inverted by a polarity inverter to $3I_O$, is equal to the sum of signals $I_A$, $I_B$ and $I_C$, which sum is zero when the system is balanced. Any system unbalance involving a ground produces a signal $3I_O$ having a magnitude proportional to the ground current. The first phasor signal $3I_O$ is applied to each of the phase monitoring means 58, 60 and 62.

Figure 4:
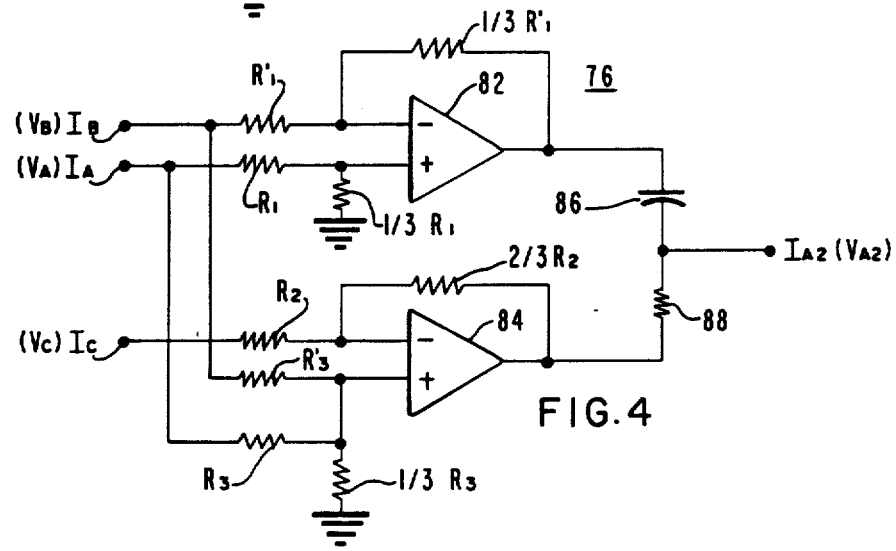
FIG. 4 is a schematic diagram of a circuit which may be used for functions shown in block form in FIG. 2, for providing signals proportional to the negative sequence currents.
Figure 4A:
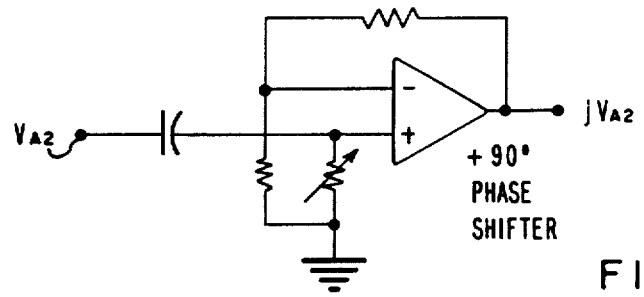
FIG. 4A is a schematic diagram of a phase shift circuit which may be used to shift the output of the circuit shown in FIG. 4 by 90° CCW, when the circuit is used to provide signals proportional to the negative sequence voltages.

The second phasor signal for each phase monitor is related to a negative sequence quantity of the three-phase system, referenced to the monitored phase, and thus a different negative sequence signal is required for each phase monitor. For purposes of example, the negative sequence current is selected for the negative sequence quantity, as it is not necessary to phase shift the negative sequence current after it is derived. While use of the negative sequence current or the negative sequence voltage provide similar results, model power system testing indicates the negative sequence voltage is marginally better behaved with a large source impedance. The negative sequence current signals will be referred to as signals $I_{A2}$, $I_{B2}$ and $I_{C2}$, for phases A, B and C, respectively, and they are provided via means 76, 78 and 80, respectively, in response to signals $I_A$, $I_B$ and $I_C$. FIG. 4 is a schematic diagram of a circuit suitable for providing the negative sequence current referenced to phase A. This same circuit may be used for means 78 and 80 by applying the input signals to the input terminals of FIG. 4, starting at the upper terminal, in the order $I_C$, $I_B$ and $I_A$ for providing signal $I_{B2}$, and in the order $I_A$, $I_C$ and $I_B$, for providing signal $I_{C2}$. The same circuit with the op amp phase shift network shown in FIG. 4A connected to its output may be used to provide the negative sequence voltages, if used instead of the negative sequence currents. Of course, voltage signals will be applied to its inputs, instead of the current related signals.

The circuit shown in FIG. 4 for means 76 is the same as that shown and described in U.S. Pat. No. 4,146,913, which is assigned to the same assignee as the present application. Since the development of the negative sequence signal via this circuit is fully described in this patent, this patent is hereby incorporated into the present application by reference, and a detailed description will not be repeated herein. It is sufficient, for purposes of the present invention, to say that a pair of op amps 82 and 84 are required, with op amp 82 being connected to receive signals $I_B$ and $I_A$ at its inverting and non-inverting inputs, respectively, via resistors $R'_1$ and $R_1$, respectively. A feedback resistor ⅓ $R'_1$ connects its output to its inverting input, and a resistor ⅓ $R_1$ connects its non-inverting input to ground. The output of op amp 82 is thus responsive to ⅓ $(I_A - I_B)$.

Op amp 84 is connected to receive signals $I_A$, $I_B$ and $I_C$ with signals $I_A$ and $I_B$ being applied to its non-inverting input via resistors $R_3$ and $R'_3$, respectively, with signal $I_C$ being applied to its inverting input via a resistor $R_2$. A feedback resistor ⅔ $R_2$ is connected from its output to its inverting input, and a resistor ⅓ $R_3$ is connected from the non-inverting input to ground. Its output provides a signal responsive to ⅓ $(I_A + I_B - 2I_C)$.

A capacitor 86 and a resistor 88 are serially connected between the outputs of op amps 82 and 84, in the recited directional sequence, and their junction provides a signal responsive to ⅓ $(I_A + \alpha^2 I_B + \alpha I_C)$, which is the negative sequence current $I_{A2}$ referenced to phase A. Signal $I_{A2}$ is an input of phase monitoring means 58. In like manner, means 78 and 80 provide signals $I_{B2}$ and $I_{C2}$ for phase monitoring means 60 and 62, respectively.

The third phasor signal for each phase monitor is also referenced to the monitored phase, and a different signal is thus required for each monitor. These signals are referred to as signals $V_{BC}$, $V_{CA}$ and $V_{AB}$ for the phase A, B and C monitors 58, 60 and 62, respectively, and they are provided via means 90, 92 and 94, respectively. The signal $V_{BC}$ for the phase A monitor 58 is the phase-to-phase voltage, or line-to-line voltage, between the phases not being monitored.

Figure 5:
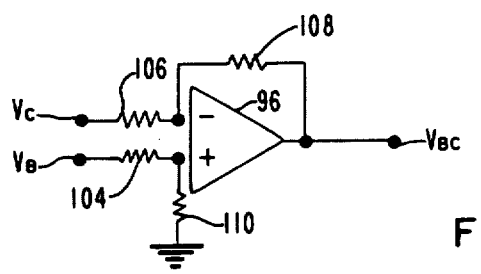
FIG. 5 is a schematic diagram of apparatus which may be used for functions shown in block form in FIG. 2, for providing signals proportional to the quadrature voltages.

FIG. 5 is a schematic diagram of a circuit which may be used by means 90 to produce signal $V_{BC}$ for the phase A monitor 58. The same circuit may be used for means 92 and 94 to provide signals $V_{CA}$ and $V_{AB}$, respectively, by applying the input signals to the circuit of FIG. 5, starting at the upper terminal, in the order $V_A$ $V_C$ for means 92, and in the order $V_B$ $V_A$ for means 94.

Figure 6:
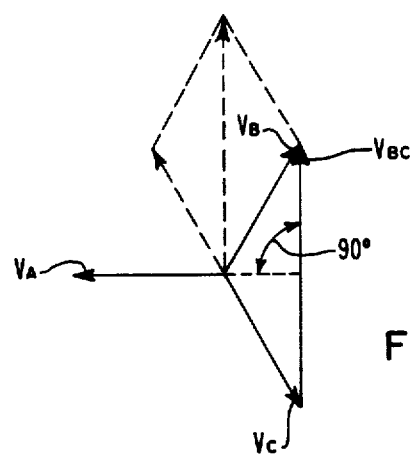
FIG. 6 is a phasor diagram which illustrates the quadrature voltage $V_{BC}$ for phase $V_A$.

The circuit of FIG. 5 includes an op amp 96. Op amp 96 is connected as a subtracter, with signals $V_B$ and $V_C$ being applied to its non-inverting and inverting inputs via resistors 104 and 106, respectively, with a feedback resistor 108 connecting its output to its inverting input, and with a resistor 110 connecting its non-inverting input to ground. The output of op amp 96 is thus equal to $V_B - V_C$, which, as shown in the vector diagram of FIG. 6, is the phase-to-phase voltage $V_{BC}$. It will be noted in FIG. 6 that the phase-to-phase voltage $V_{BC}$ is 90° out of phase with the phase A voltage $V_A$, and $V_{BC}$ is thus referred to as the quadrature voltage for phase A.

The phase A monitor 58 compares the phase angles of phasor signals $3I_O$, $I_{A2}$ and $V_{BC}$. Only the positive half cycles may be compared, only the negative half cycles may be compared, or, as shown in FIG. 2, in order to obtain the fastest possible detection, the positive half cycle may be compared with one another, and the negative half cycles my also be compared with one another.

A single-phase-to-ground fault on a three-phase electrical power system will cause the monitored phasors to be within 60° of one another on the faulted phase. The monitored signals will not be within 60° of one another on the sound phases. Further, with a phase-to-phase-to-ground fault, the monitored signals will not be within 60° of one another for any phase.

Figure 8:
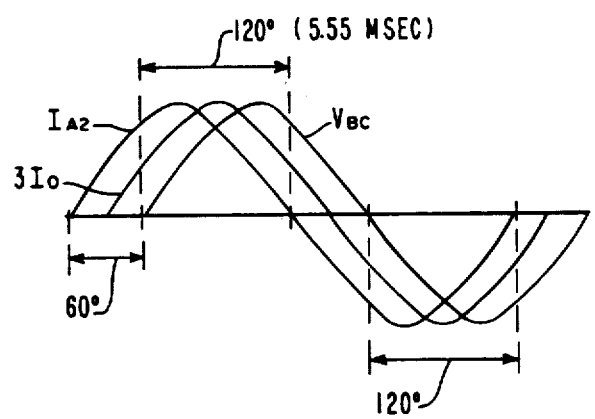
FIG. 8 is a graph which illustrates the positive and negative coincidence of certain signals which indicate the phase associated with the signals is the faulted phase of a single-phase-to-ground fault on the associated electrical power system.

As shown in the diagram of FIG. 8, if the three monitored signals $3I_O$, $I_{A2}$ and $V_{BC}$ are within 60° of one another, the time of positive coincidence will be at least 5.55 msec for a 60 Hz. system, and the time of negative coincidence will be at least 5.55 msec. If the phase angles are closer than 60°, this time will increase, and if the phase angle spread exceeds 60°, this time will decrease. Thus, the phase A monitor may include AND gates 126 and 128, inverter gates 130, 132 and 134, and an OR gate 136. A time-delay unit 138 is also provided which has a pick-up time of 5.55 msec, and a dropout time of 10 msec. If an input signal to unit 138 does not persist for 5.55 msec, the time-delay unit 138 will provide no output. If the input signal persists for at least 5.55 msec, its output will go high and persist for 10 msec following the termination of the input signal.

Phasor signals $3I_O$, $I_{A2}$ and $V_{BC}$ are applied directly to inputs of AND gate 126, and to inputs of AND gate 128 via polarity inverters 130, 132 and 134. The outputs of AND gates 126 and 128 are applied to time-delay unit 138 via OR gate 136. If the time of positive coincidence, or the time of negative coincidence, is at least 5.55 msec, the time-delay unit 138 will provide a true output signal $T_{AG}$, which may be used to initiate tripping of the phase A power circuit breaker 26, as the high or true output $T_{AG}$ indicates a phase A to ground fault on the three-phase electrical power system 20.

The monitors 60 and 62 for phases B and C, respectively, are similar to the phase A monitor 58, and thus need not be described in detail.

Figure 7:
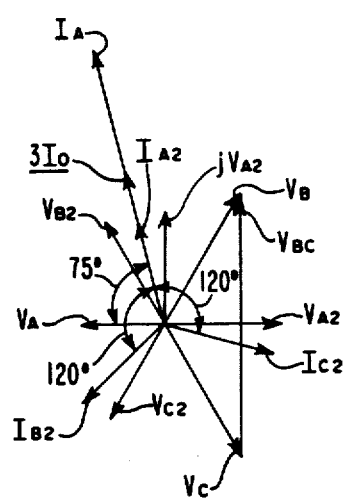
FIG. 7 is a phasor diagram which illustrates the phase A monitoring signals for a phase A-to-ground fault (AG)

Phasor diagrams for selected fault conditions will now be examined, to illustrate the effectiveness of the methods and apparatus of the present invention in detecting a single-phase-to-ground fault, and for correctly identifying the faulted phase. First, a single-phase-to-ground-fault will be examined, with phase A being the faulted phase. As shown in FIG. 7, the phase A current $I_A$ will lag the phase A voltage $V_A$ by the fault angle, which is approximately 75°. The $3I_O$ current and the negative sequence current referenced to phase A are substantially inphase with $I_A$, and with one another. The phasor $V_{BC}$, shown in FIG. 6, is about 15° out of phase with the $3I_O$ and $I_{A2}$ signals. Thus, the phase A monitor will output a true signal $T_{AG}$. FIG. 7 also illustrates that $jV_{A2}$ may be used instead of $I_{A2}$, as $jV_{A2}$ is close to being in phase with $3I_O$.

Figure 9A:
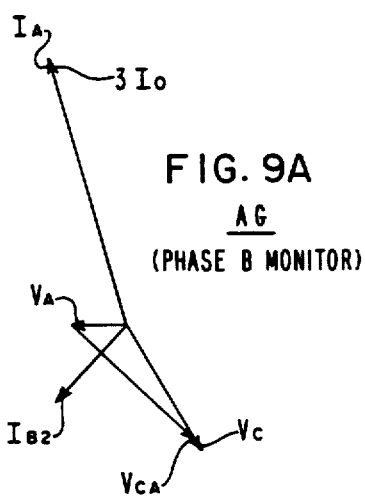
FIGS. 9A and 9B are phasor diagrams which illustrate the phase B and phase C monitoring signals, respectively, for an AG fault.
Figure 9B:
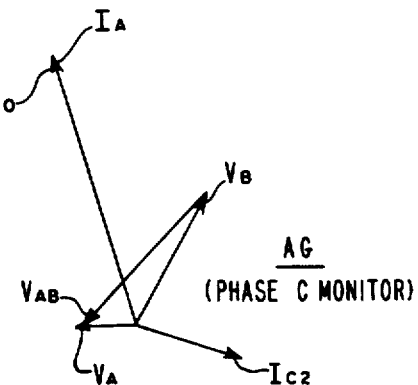

FIGS. 9A and 9B are phasor diagrams which illustrate the signals applied to the phase monitors for phases B and C, respectively, when a phase A to ground fault exists. As illustrated, the negative sequence currents referenced to the B and C phases are 120° out of phase with the signal $3I_O$. Thus, the monitors for phases B and C provide low output signals $T_{BG}$ and $T_{CG}$, respectively.

Figure 10:
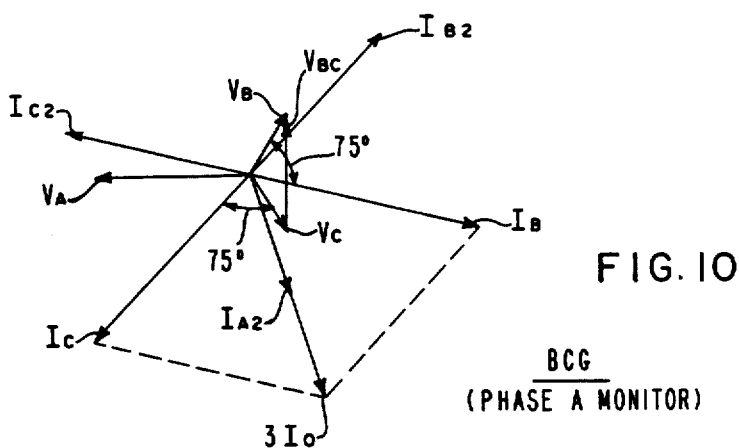
FIG. 10 is a phasor diagram which illustrates signals associated with the phase A monitor for a BCG fault, when the net impedance to the monitoring point from the fault is inductive.

A phase-to-phase-to-ground fault will now be considered, with phases B and C being selected as the faulted phases for purposes of example. The signals applied to the phase A monitor are shown in FIG. 10 for the situation where the net impedance from the fault to the measuring point is inductive. While the $3I_O$ signal and the negative sequence signal $I_{A2}$ reference to phase A are inphase for the unfaulted phase, improper selection of phase A as a faulted phase is prevented by signal $V_{BC}$ which is almost 180° out of phase with these signals.

Figure 11:
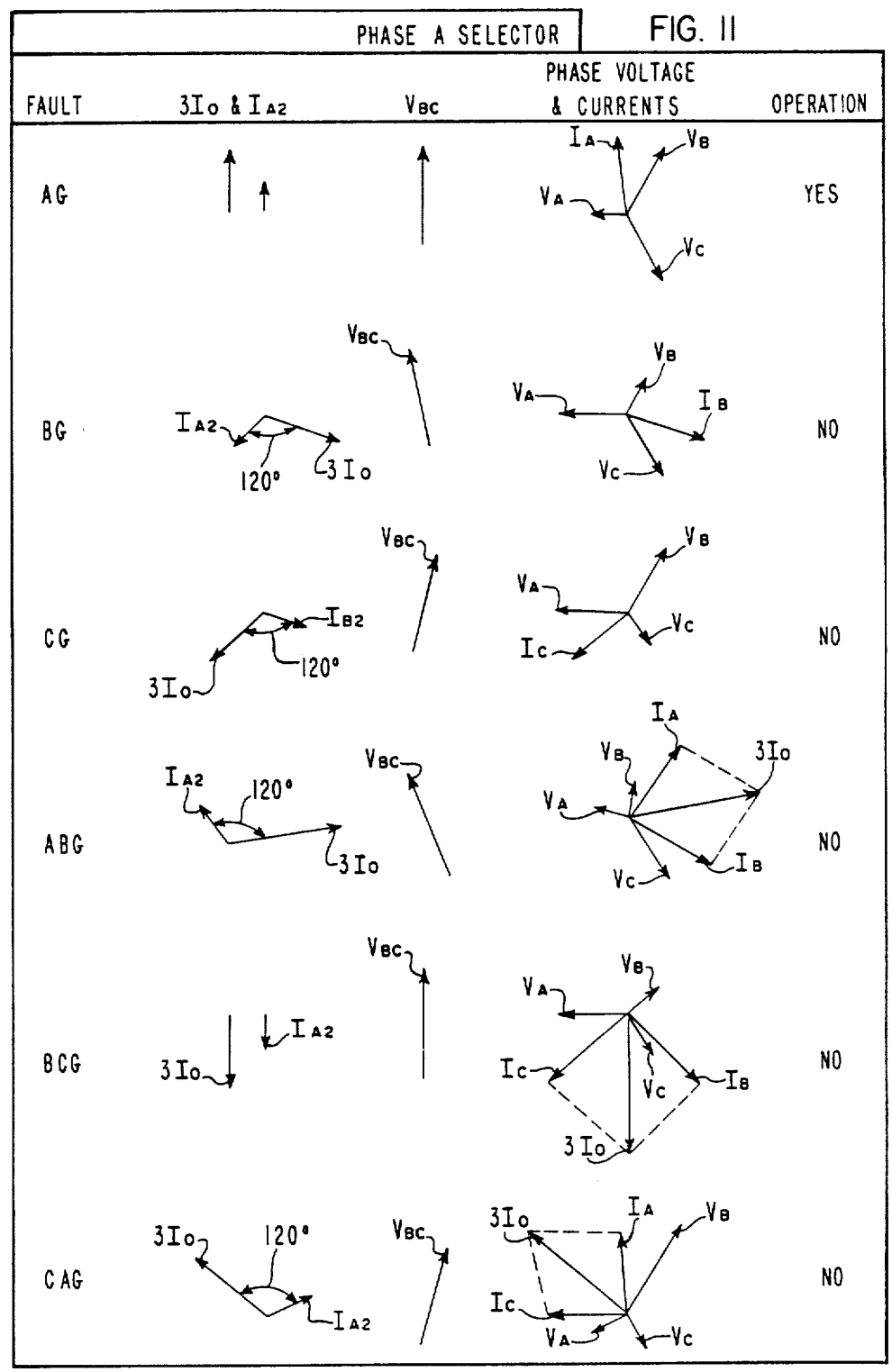
FIG. 11 is a chart which sets forth various phasor signals for different fault configurations, referenced to the phase A monitor.

FIG. 11 is a chart which sets forth various fault configurations and the phasor signals applied to the phase A monitor or selector, which illustrates that a phase selector for indicating single-phase-to-ground faults, and the faulted phase, will operate correctly for all fault configurations.

I claim as my invention:

1. Apparatus for detecting a single-phase-to-ground fault in a three-phase electrical power system, comprising:
    means providing a first phasor signal responsive to unbalanced current in the three-phase system,
    means providing a second phasor signal indicative of a negative sequence quantity, referenced to the phase being monitored,
    means providing a third phasor signal responsive to the quadrature voltage of the phase being monitored,
    comparison means comparing the phase angles of said first, second and third phasor signals,
    said comparison means providing a signal which indicates a single-phase-to-ground fault on the three-phase system, with the fault being on the phase being monitored, when the phase angles have a predetermined relationship.

2. The apparatus of claim 1 wherein the quadrature voltage is the line-to-line voltage whose phase angle is normal to the phase angle of the phase voltage being monitored.

3. The apparatus of claim 1 wherein the predetermined relationship of the phase angles in the phase angles all being within a predetermined number of electrical degrees of one another.

4. The apparatus of claim 3 wherein the predetermined number of electrical degrees is 60°.

5. The apparatus of claim 1 wherein the comparison means compares the coincidence of a selected polarity of the first, second and third signals, and wherein the comparison means provides an output signal when the coincidence of like polarities exceeds a predetermined period of time.

6. The apparatus of claim 5 wherein the predetermined period of time is 120 electrical degrees.

7. The apparatus of claim 1 wherein the negative sequence quantity is the negative sequence current.

8. The apparatus of claim 1 wherein the negative sequence quantity is the negative sequence voltage phase shifted by +j.

9. Apparatus for detecting a single-phase-to-ground fault in a three-phase electrical power system having phases A, B and C, phase voltages $V_A$, $V_B$ and $V_C$, line voltages $V_{AB}$, $V_{CA}$ and $V_{BC}$, and phase currents $I_A$, $I_C$ and $I_B$, and for identifying the faulted phase, comprising:
    means providing a first phasor signal responsive to the sum of the phase currents $I_A$, $I_B$ and $I_C$,
    means providing second, third and fourth phasor signals responsive to a negative sequence quantity referenced to phases A, B and C, respectively,
    means providing fifth, sixth, and seventh phasor signals responsive to $V_{BC}$, $V_{CA}$ and $V_{AB}$, respectively,
    first detector means for providing an output signal indicating a phase A-to-ground fault when said first, second and fifth phasor signals are within a predetermined number of electrical degrees of one another,
    second detector means for providing an output signal indicating a phase B-to-ground fault when said first, third and sixth phasor signals are within said predetermined number of electrical degrees of one another,
    and third detector means for providing an output signal indicating a phase C-to-ground fault when said first, fourth and seventh phasor signals are within said predetermined number of electrical degrees of one another.

10. The apparatus of claim 9 wherein the predetermined number of electrical degrees is 60°.

11. A method of detecting a single-phase-to-ground fault in a three-phase electrical power system, comprising the steps of:
    providing a first phasor signal responsive to the sum of the three phase currents in the three-phase system,
    providing a second phasor signal indicative of a predetermined negative sequence quantity, referenced to the phase being monitored,
    providing a third phasor signal responsive to the quadrature voltage for the phase being monitored,
    comparing the phase angles of said first, second and third phasor signals,
    and providing a signal indicating a single-phase-to-ground fault of the monitored phase when the step of comparing the phase angles detects a predetermined phase angle relationship.

* * * * *